4,462,658

United States Patent [19]

Scifres et al.

[11] Patent Number: 4,462,658

[45] Date of Patent: Jul. 31, 1984

[54] OPTICAL SCANNER

[75] Inventors: Donald R. Scifres, Los Altos; Robert D. Burnham, Los Altos Hills; William Streifer, Palo Alto, all of Calif.

[73] Assignee: Xerox Corporation, Stamford, Conn.

[21] Appl. No.: 342,950

[22] Filed: Jan. 26, 1982

Related U.S. Application Data

[62] Division of Ser. No. 187,912, Sep. 17, 1980, Pat. No. 4,360,921.

[51] Int. Cl.³ .............................................. G02B 5/174
[52] U.S. Cl. ...................................... 350/96.14; 350/6.1
[58] Field of Search ................... 350/6.1, 96.11, 96.12, 350/96.13, 96.14

[56] References Cited

U.S. PATENT DOCUMENTS 4,047,795  9/1977  Hughes et al. ................... 350/96.14
4,415,226 11/1983  Verber et al. ................... 350/96.14

OTHER PUBLICATIONS

Holladay, "Integrated Optics Scanner," Xerox Disclosure Journal, vol. 2, No. 1, Jan./Feb. 1977, p. 49.
Sasaki et al., "Electro-Optic Multichannel Waveguide Deflector," Electron. Lett., vol. 13, No. 10, May 1977, pp. 295-296.

Primary Examiner—John D. Lee
Attorney, Agent, or Firm—W. Douglas Carothers, Jr.

[57] ABSTRACT

An optical scanner with a thin waveguide medium on a substrate includes means to couple a wide collimated beam of radiation into one end of the medium. A periodic array of substantially parallel, spaced electrodes are associated with one major surface of the medium. At least a portion of their electrode lengths extend in a direction substantially parallel with the direction of radiation propagating through the medium. Supply means is provided to apply voltages in a pattern to the electrodes which varies from one electrode to the next adjacent electrode to a predetermined value over several of the electrodes and the same pattern of voltages or a similar pattern of different voltages is applied over several of the next adjacent electrodes up to the predetermined value. In this manner, the pattern is completed across the electrode array to produce a corresponding approximation of a desired phase retardation along a phase front of the propagating radiation in the medium. Further means is employed to change the magnitude of the applied voltages across the electrode array to vary the approximation of the phase retardation to cause the radiation beam to scan in a direction of radiation propagation in the medium.

3 Claims, 17 Drawing Figures

OPTICAL SCANNER

This is a division of application Ser. No. 187,912, filed Sept. 17, 1980, now U.S. Pat. No. 4,360,921.

BACKGROUND OF THE INVENTION

This invention relates to electrooptical scanning devices and more particularly to monolithic laser scanning devices comprising a means for coupling a wide collimated beam of radiation with an integral optical deflection region.

One of the desired aims in electrooptic scanning devices is the provision of a monolithic solid state laser beam scanner wherein a coherent light beam or radiation produced from an internal light or radiation source is coupled directly into a light scanning region operative to cause the far field beam to scan across an image plane or to focus the beam to a spot in the far field and scan the spot across the image plane. The difficulty with such a structure is the complexity of fabrication and the means by which the phase front of the light might be effectively controlled to produce a continuous scanned beam or spot.

An example of a laser beam scanner is disclosed in Ser. No. 918,740 filed June 26, 1978, which is assigned to the assignee herein. The scanner disclosed is of the moving interference fringe pattern type wheren the monolithic structure has a source of coherent radiation and integral wave guiding region for guiding the radiation along a plurality of spatially displaced optically uncoupled paths to produce two or more emitting filaments. By producing a relative phase change from the light in one path relative to another, the interference fringes in the far field can be caused to spatially scan across an image plane.

By introducing an electrically controlled optical phase shift between two or more coherent emitting filaments produced by this monolithic structure, beam direction in the far field can be controlled. The resolution of the beam is directly proportional to the number of emitting filaments. For higher resolution, it is imperative to establish a means of controlling the phase of the radiation light to a predetermined number of coherent optical emitting filaments. For the simplest configuration, this requires at least $N+1$ electrical contacts to be employed with the structure if N resolvable spots are to be obtained in order that the optical phase of the filaments are properly controlled.

To provide high resolution, such as a monolithic laser beam scanner with 1,000 or more resolvable spots, a large number of contacts greater than 1,000 are required.

SUMMARY OF THE INVENTION

According to this invention, an optical scanner with a thin waveguide medium on a substrate includes means to couple a wide collimated beam of radiation into one end of the medium. A periodic array of substantially parallel, spaced electrodes are associated with one major surface of the medium. At least a portion of their electrode lengths extend in a direction substantially parallel with the direction of radiation propagating through the medium. Supply means is provided to apply voltages in a pattern to the electrodes which varies from one electrode to the next adjacent electrode to a predetermined value over several of the electrodes and the same pattern of voltages or a similar pattern of different voltages is applied over several of the next adjacent electrodes up to the predetermined value. In this manner, the pattern is completed across the electrode array to produce a corresponding approximation of a desired phase retardation along a phase front of the propagating radiation in the medium. Further means is employed to change the magnitude of the applied voltages across the electrode array to vary the approximation of the phase retardation to cause the radiation beam to scan in a direction of radiation propagation in the medium.

Voltages are applied to each of the electrodes in the array which vary to a predetermined value over several of the electrodes in a repeated manner to establish a periodic electric field diffraction grating across the array. This grating effect produces a corresponding phase retardation along the phase front of the radiation propagating in the extended portion of the passive waveguide portion. By modulationally changing the levels of the applied voltage across the electrode array, the phase retardation along the phase front can be systematically varied to cause the radiation in the far field to scan in a direction transverse to the direction of propagation.

The voltages may be individually supplied to the array electrodes in a linear manner to produce a linear phase front across the beam. Changing the angle of the phase front on a continuous basis will cause the beam to scan across an image plane. On the other hand, these voltages can be applied in a curvalinear manner to produce a curved phase front across the beam to bring the radiation continuously into a focus as a spot, and as the spot is moved or scanned across an image plane.

Voltages may be applied to produce an array of independent beams or spots with each beam or spot capable of being scanned across an image plane. Thus, the device will function as a beam splitter and multiple beam scanner.

The electrodes may be provided with either a symmetric or asymmetric spatial periodicity. The electrodes are independently connected to a voltage supply source so as to be independently addressed, one relative another, in a variable and periodic manner across the electrode array. The electrodes may be referenced to a common electrode plane or adjacent common electrodes or referenced relative to each other.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
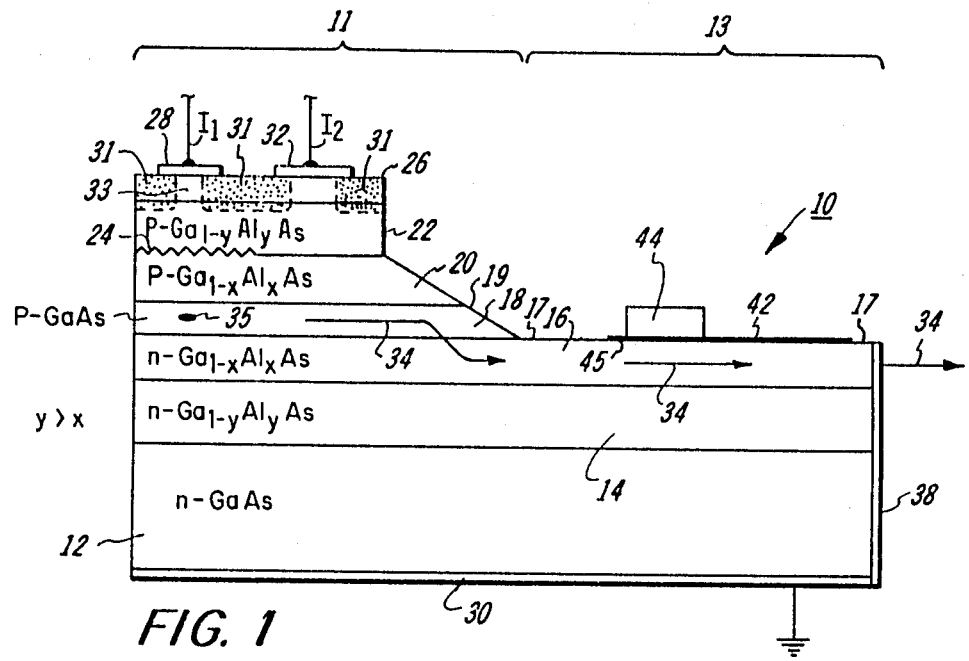
FIG. 1 is side elevation illustrating a monolithic laser scanning device comprising this invention.
Figure 2:
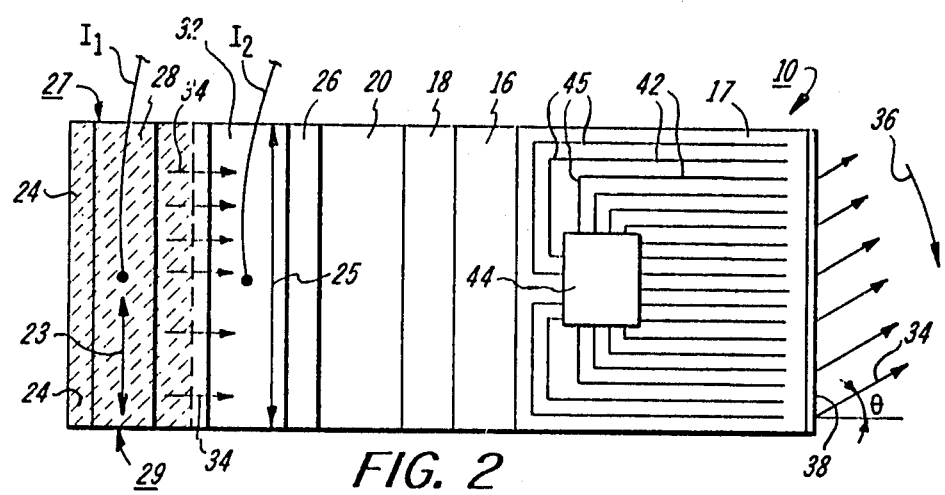
FIG. 2 is a plan view of the device disclosed in FIG. 1.

Referring to FIGS. 1 and 2, the monolithic laser scanning device 10 comprises a heterostructure injection laser region 11 and integral optical scanning region 13. Laser scanning device 10 may be fabricated using either liquid phase epitaxy or vapor phase epitaxy, such as, metalorganic chemical vapor deposition or molecular beam epitaxy.

Included in both regions are substrate 12 and contiguous cladding layer 14 and transparent or passive waveguide layer 16. The laser region 11 also includes active layer 18, contiguous with a portion of the passive waveguide layer 16, passive waveguide layer 20, cladding layer 22 and contact layer 26. A periodic grating 24 is provided at a portion of the interface between layers 20 and 22. To complete the basic structure, a metal electrode 30 is deposited on the bottom surface of substrate 12.

In order to provide current confinement, portions of layers 22 and 26 are proton or ion bombarded to convert the regions 31 of high conductivity outside the channel 33 into material of relatively high resistivity. This fabrication procedure is documented in the art.

Electrode 28 is deposited on one portion of the surface of contact layer 26 and electrode 32 is deposited on another portion of the surface of contact layer 26. Electrode 28 is connected to a current source $I_1$, while electrode 32 is connected to a current source $I_2$. The portions of region 11 directly below electrode 28 are the laser propagation cavity and radiation source while the portion of region 11 directly below electrode 32 is the amplifier section. The amplifier section is optional and may be eliminated for low power applications. The amplifier provides additional stimulated carrier recombination for radiation propagating in a direction perpendicular to the laser propagating cavity.

Carrier recombination occurs in active layer 18 relative to the heterostructure p-n junction established between layers 16 and 19. Upon application of pumping current $I_1$, via electrode 28, a radiation propagating cavity is established in active layer 18 with resonator feedback provided by the mirror facets 27 and 29. The radiation 35 produced in the active layer 18 by carrier recombination propagates (arrow 23) in a cavity parallel to the elongated extent of electrode 28.

The facets 27 and 29 may be provided with additionally deposited mirrors, such as dielectric stack mirrors, as are known in the art.

Layers 16 and 18 function as optical waveguides and provide lateral light wave guidance independent of charge injection and carrier recombination occurring in the active layer 18.

The semiconductor materials comprising layers 12–26 may be n-GaAs for substrate 12, n-Ga$_{1-y}$Al$_y$As for layer 14, n-Ga$_{1-x}$Al$_x$As for optical waveguide layer 16, p-GaAs for active layer 18, p-Ga$_{1-x}$Al$_x$As for optical waveguide layer 20, p-Ga$_{1-y}$Al$_y$As for cladding layer 22 and p-GaAs for contact layer 26 and wherein molar fraction, y, is greater than x. Layers 16 and 20 may, for example, be respectively, n and pGa$_{0.9}$Al$_{0.1}$As and layers 14 and 22 may be, respectively, n and p-Ga$_{0.7}$Al$_{0.3}$As. Dopant concentrations for layers 12–16 are well known in the art.

As an example, the thickness of each of the layers 14, 16, 18, 20, 22 and 26 may, respectively, be about 100 μm, 2 μm, 0.5 μm, 0.1 μm, 0.5 μm, and 1.5 μm.

Also, as well known in the art, different alloy compositional materials and systems may be employed. For example, InP substrates may be employed for substrate 12 with lattice matched deposited layers of In$_{1-x}$Ga$_x$As$_{1-y}$P. Also, the conductivity type of the epitaxial deposited layers of device 10 may be reversed.

The periodic grating 24 is formed at an angle of 45° to the direction of propagating radiation and is provided with a spatial period that is substantially equal to an integer number of one or more of the predominate wavelengths of radiation established in the laser cavity. Grating 24 deflects a substantial portion of the radiation 23 from the established optical cavity in layers 16-18-20 into a broad perpendicular cavity region in these same layers. Since the grating is present for the full length of the laser cavity, a wide beam of radiation is provided across the full width of the device, as indicated by the arrow 25. This wide beam of radiation is basically a high volume of optical light emitters established by the perturbations of the periodic grating 24.

The propagating radiation in the longitudinal cavity of region 11 undergoes additional stimulated emission and carrier recombination by means of pumping current $I_2$ applied at electrode 32.

The transverse radiation established longitudinally in the larger optical cavity of layers 16-18-20 may be coupled directly into an adjacent waveguide medium in such free space or a solid state waveguide. In FIG. 1, the transversely directed radiation is coupled (arrow 34) into the underlying passive waveguide layer 16 by means of the tapered coupler 19. The coupled radiation undergoes little optical transmission loss since layer 16 has a higher bandgap than active layer 18.

As previously indicated, waveguide layer 16 together with cladding layer 14 and substrate 12 extend through optical deflection region 13. The outer ends of these layers are provided with an antireflection coating 38 so that the radiation 34 propagating in the extended portion of layer 16 undergoes very little or no reflection at the extreme end so that the radiation is substantially transmitted into free space.

Figure 3:
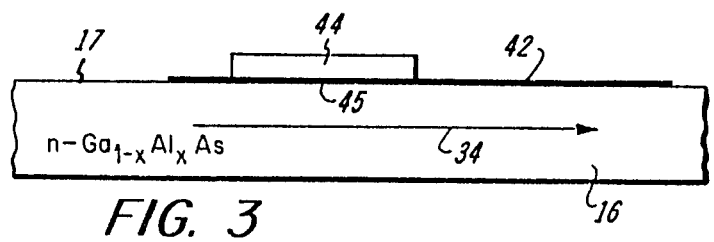
FIG. 3 is an enlarged view of the electrode array shown in FIG. 1.
Figure 7:
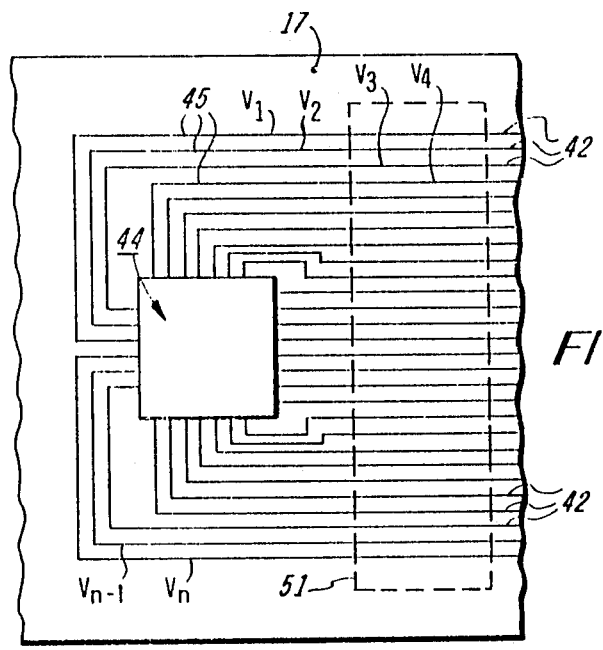
FIG. 7 is an enlarged view of the electrode array shown in FIG. 2.

As shown best in FIGS. 3 and 7 driving chip 44 is positioned on the surface 17 of waveguide layer 16. The chip 44 is fabricated by VLSI techniques. An array of electrodes 42 are deposited on the surface 17 of the waveguide layer 16 across its entire width. The electrodes 42 may be evaporated, electroplated or otherwise deposited on surface 17. Employing selective masking, each electrode is properly coupled at its extended end portion 45 to a leadout from the driving chip 44. Coupling may be accomplished by solder bumping end portions 45 to external leadouts from driving chip 44. The electrodes may also be configured as Schottky barriers or p-n junctions.

As an alternative, the electrodes 42 may be deposited on a separate medium, as suggested in German DT No. 2910238, published Sept. 20, 1979. The electrodes are positioned to be extended lengthwise of the waveguide layer 16 and in contact with surface 17.

In FIG. 1, the electrodes 42 in combination with the bottom electrode 30 may be voltage addressed to produce an electric field gradient transversely through the bulk of waveguide layer 16. In this configuration, the distance between the electrodes 42 and plane electrode 30 is smaller than the distance between adjacently disposed electrodes 42.

Figure 4:
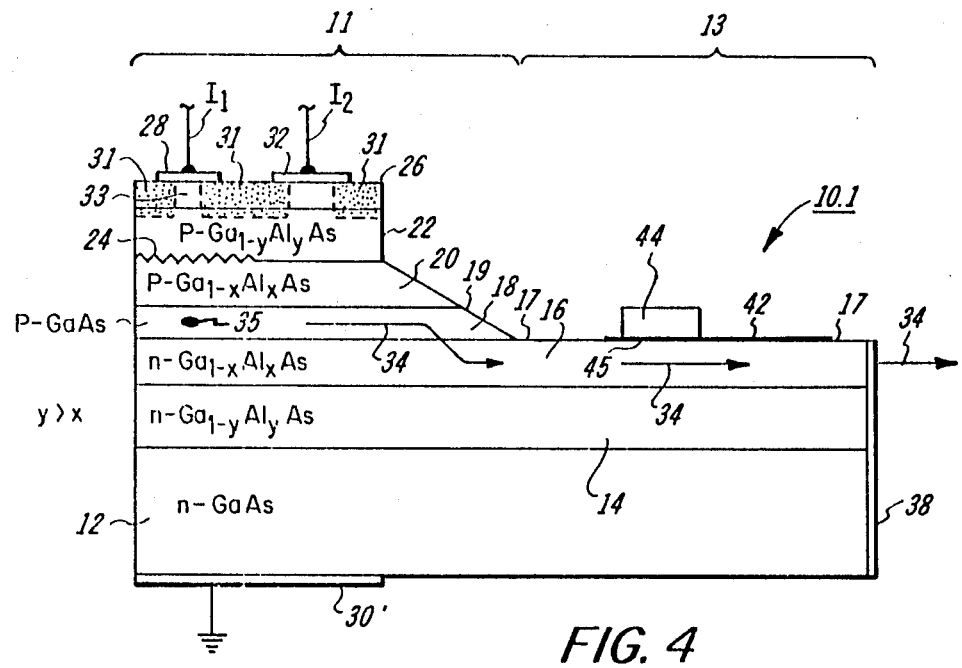
FIG. 4 is a modified structure of the monolithic laseer scanning device shown in FIG. 1.

The monolithic laser scanning device 10.1 in FIG. 4 is identical to the device 10 in FIG. 1 except that the flat bottom electrode does not extend over the entire bottom surface of the device. Electrode 30' provides a current path for currents I and $I_2$ through the injection laser region 11 of the device. Voltages applied to the electrodes 42 function to induce fringe fields through surface 17 of the waveguide layer 16. These fields are established through the surface of the waveguide 16 from one discrete electrode to the next adjacent electrode.

By applying a predetermined periodic voltage pattern to the electrodes of either of devices of FIGS. 1 and 2, the internal radiation 34 propagating in the extended portion of layer 16 may be caused to be deflected and scanned, as indicated by arrow 36 in FIG. 2.

The beam of radiation 34 travels in a direction generally parallel with the electrode array. The voltages applied to the electrodes are applied in steps, i.e., they are steps from one discrete value to another to provide discrete separation of the positions of propagating radiation in the waveguide 16. Different refracted orders of radiation of roughly equal intensity are produced across the width of the propagating radiation. The applied voltage pattern induces a grating effect due to the influence of the electrode applied electric field which causes the light in waveguide 16 to diffract. This diffraction produces an output beam 34 which may be controlled in a manner to produce the scanning action indicated by the arrow 36. Details of the voltage application and addressing scheme will be explained later in greater detail.

Figure 5:
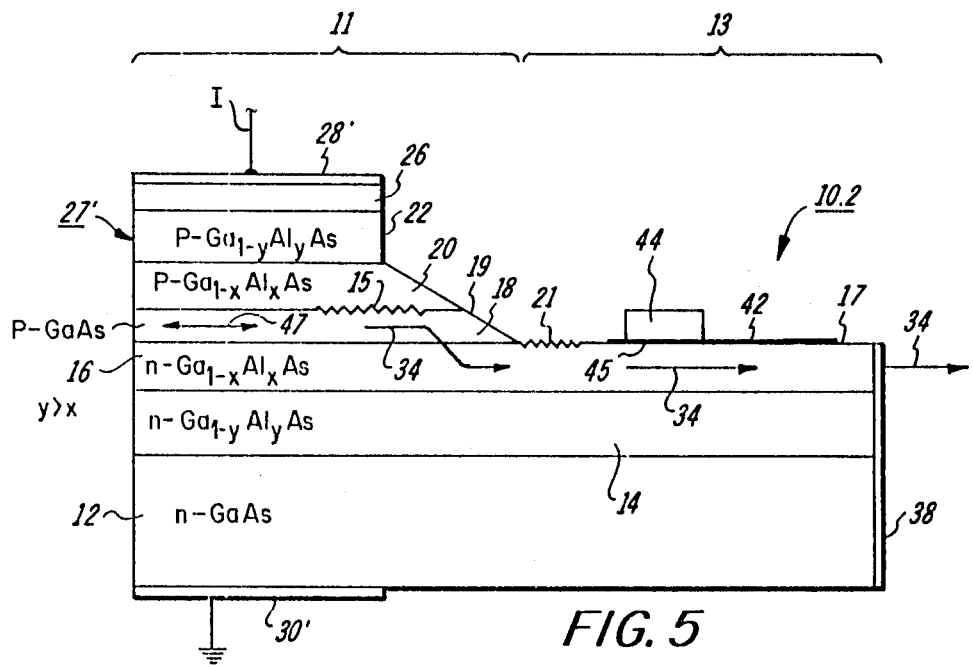
FIG. 5 is another embodiment of the monolithic laser scanning device shown in FIG. 1.

The laser scanning device 10.2 in FIG. 5 is the same as the device 10.1 of FIG. 4 relative to the optical deflection region 13. However, in the injection laser region 11, radiation propagation (indicated by arrow 47) is in a laser cavity established in active layer 18 in the longitudinal direction of the device. Epitaxial processing is carried out on substrate 12 so that the crystal cleaving occurs at the (110) surfaces. The surface 27' forms a cleaved mirror facet which provides optical feedback for light propagation 47. To complete feedback a periodic grating is employed in the propagating cavity. The periodic grating or distributed Bragg reflector (DBR) may be employed at various semiconductor layer interfaces. In the laser region 11, the grating may be employed at the interface between layers 14 and 16, or layers 16 and 18, or layers 18 and 20, or layers 20 and 22. The DBR 15 is shown in FIG. 5 at the interface of layers 18 and 20.

On the other hand, the periodic grating or DBR may be fabricated in the optical scanning region 13. In this case, the grating may be employed at the interface of layers 14 and 16 or on the surface 17 of waveguide layer 16. DBR 21 is shown in FIG. 5 on the surface 17 adjacent to tapered coupler 19.

The DBRs 15 and 21 are not employed together in the same structure. Only one such grating is needed to replace one of the facets used to provide optical feedback.

The period of the grating is an integer multiple of half wavelengths of light in the waveguide cavity formed in layers 16 and 18. A small amount of the propagating radiation is reflected back into the cavity coherently at each corrugation of the grating. The total of this reflected radiation from the grating and the reflected light produced from facet 27' is sufficient feedback to permit operation of the laser device 10.2

Figure 6:
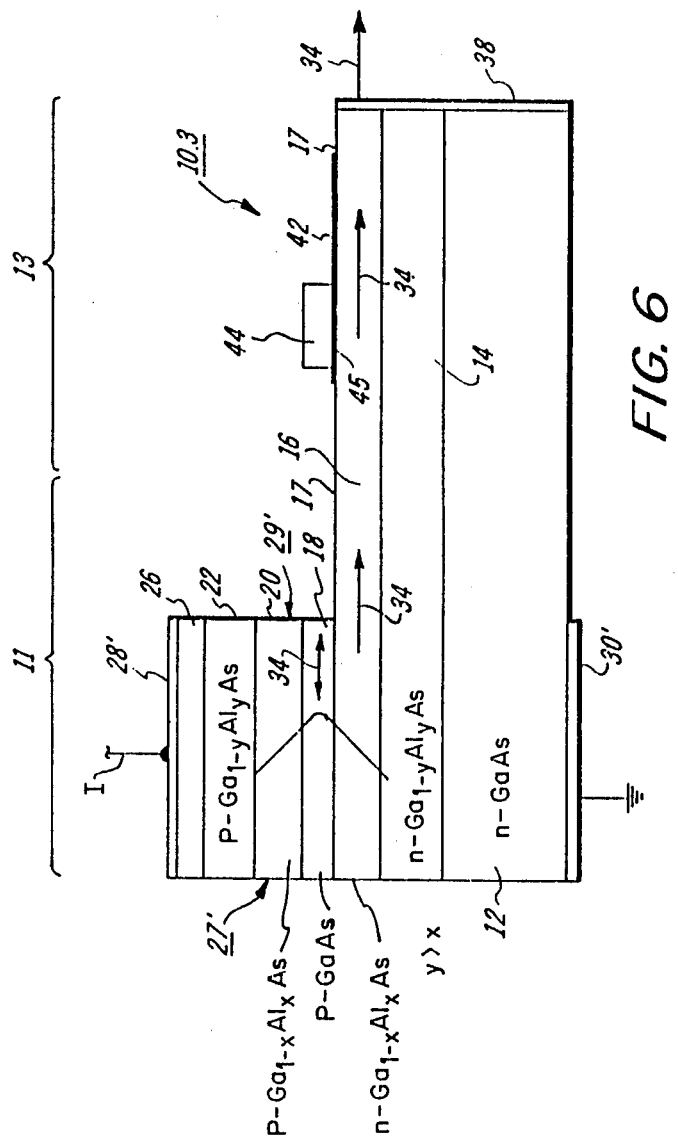
FIG. 6 is still a modified structure of the monolithic laser scanning device shown in FIG. 5.

The monolithic laser scanning device 10.3 in FIG. 6 differs from the laser scanning device 10.2 of FIG. 5 in that the tapered coupler 19 and DBRs 15 and 21 are not used. Instead, a mirror facet 27' provides a sufficient level of reflected propagating radiation into the cavity established in active layer 18. Mirror facets 27' and 29' together provide the optical feedback for lasing. The propagating radiation also spreads into transparent waveguide layers 16 and 20. A portion of this light will continue to propagate through the extended portion of waveguide layer 16 and under the array of electrodes 42.

Facet 29' must be formed sufficiently flat to act as a mirror to the propagating radiation. This surface may be formed after epitaxial formation of the device 10.3. For example, after epitaxial growth through layer 26, a groove may be formed across the width of the device in a region adjacent to the front face of the structure down to the surface of layer 16. This groove is formed by selective etching or ion milling. One surface of the groove will constitute the facet 29'. As an alternative, facet 29' may be epitaxially grown on the front face of the structure.

The area designated by the dotted line 51 in FIG. 7 represents a portion of the length of the electrode 42 that interacts with the propagating radiation 34. In the case of the device 10 disclosed in FIGS. 1–3, the electrode pitch should be close enough to provide good resolution in the far field. In the case of the devices 10 disclosed in FIGS. 4–6, the electrode pitch should be sufficiently close to permit sufficient penetration of the developed electric fringe fields into the crystal body 12 to induce a good grating effect. Generally, the induced field may extend into the crystal body 12 as much as one half the distance of the electrode pitch. The closer the electrodes, the less the amount of the applied voltage to the electrodes. But this is accompanied with a corresponding decrease of field penetration into the crystal body. A compromise may be attained and optimum spatial electrode pitch can be achieved.

Also, the electrode pitch relates to the beam scan angle desired, since the distance between electrodes is inversely proportional to the magnitude of the scan angle, i.e., the greater the distance, the smaller the scan angle.

In all cases, electrode pitch will be 10 μm or less, preferably 1 μm to 5 μm, for example. Applied voltages to electrodes 42, for example, may be from of 2 to 15 volts depending on electrode geometry and the waveguide medium material. Generally 3 to 5 volt levels have been achieved for electrode geometry which is proximity coupled to a waveguide medium and with electrode pitch within the preferred range.

Figure 10:
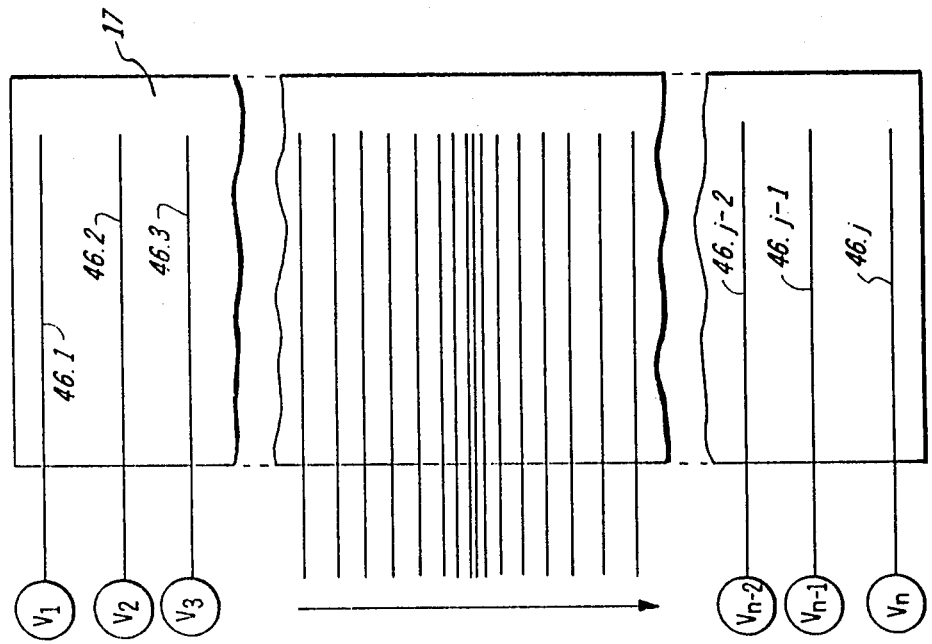
FIG. 10 is a diagrammatic illustration of the array electrodes having a varied spatial periodicity.

A variable pitch electrode arrangement may also be employed as illustrated in FIG. 10. This geometry creates a nonequally spaced pattern of electrodes 46 which will function to reduce side lobe interference and provides focusing of the far field beam scan thereby eliminating the need for a collinating lens where a divergent beam source is being used. The pattern shown is a linear periodic variation. A quadratic periodic variation may also be used.

Figure 9:
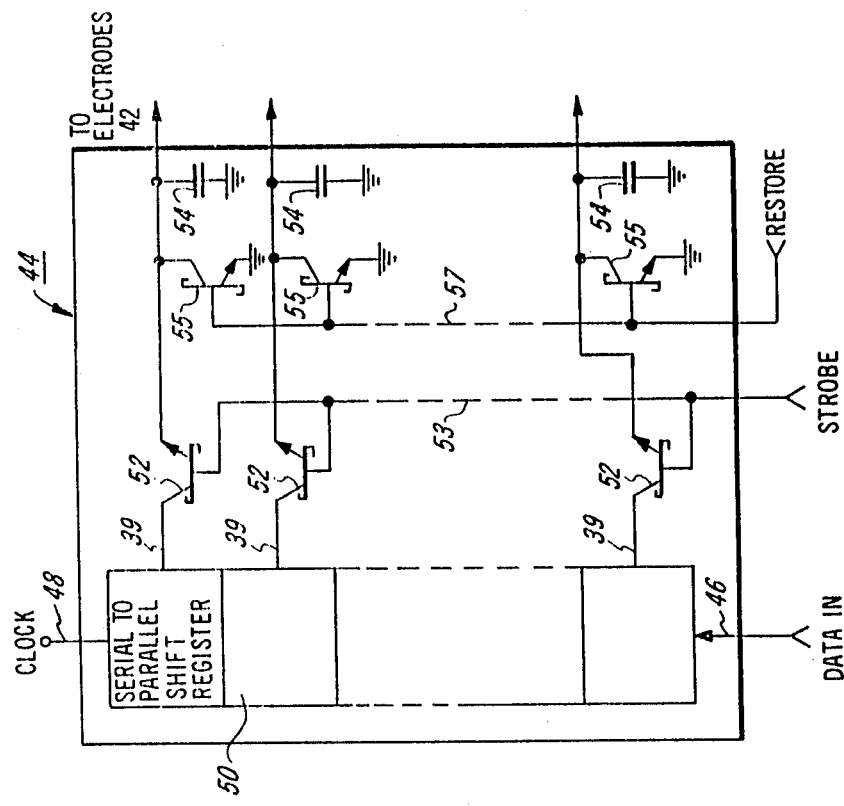
FIG. 9 is a more detailed illustration of the circuitry used for the electronic driving chip of FIG. 4.

Circuitry detail of the driving chip 44 is shown in FIG. 9. The serial to parallel shift register 50 comprises a series of cells wherein the applied address pattern may be serially clocked into the register 50 by a clock signal on line 48. As the data at input 46 is clocked into shift register 50, various voltage output levels representing the serially input address are applied in parallel at register outputs 39. The parallel outputs 39 are placed on the electrodes 42 by means of a strobe signal on line 53 connected to the base of each switching transistor 52. The collector of each transistor 52 is connected to an output 39 and each emitter is connected to an electrode 42.

The transistor 52 may be Schottky clamped transistors for short turnoff times and greater operating speed.

The holding capacitors 54 are connected to ground and electrodes 42 and provide a hold circuit for the voltages applied to the electrodes 42. The restoration circuit includes the transistors 55 having their emitters connected to ground and their collectors connected to electrodes 42. The restore signal is applied on line 57 to the base of each transistor 55.

In practice, capacitors 54 may not be necessary because the capacitance of the electrodes relative to a reference or ground may be sufficient.

In operation, voltage levels at outputs 39 are applied to holding application of a strobe signal on line 53. The capacitors 54 are charged to the applied voltage values and the voltages are imposed on the electrodes 42. To restore the voltage levels to a reference voltage level, a restore signal on line 57 will connect each of the capacitors 54 to ground through the low impedance transistors 55. The capacitors 55 are discharged upon the application of the restore signal and next voltage values at outputs 39 can be strobed to the electrodes upon removal of the restore signal from line 57.

Instead of employing transistors 52 and 55, T²L drivers may be employed with register 50 and the voltage level switching may be accomplished by bipolar MOSFET transistors in place of the Schottky clamped transistors 52. Register 50 would be a bipolar random access memory with T²L drivers. The memory is sequentially addressed with a counter which feeds the data into the memory under clock control. The T²L drivers provide the proper voltage levels at outputs 39. These voltages are applied to electrodes 42 and capacitors 54 via bipolar MOSFETS. Applied voltage levels may be continuously changed to greater and lesser values under this arrangement.

FIG. 8 illustrates various electrode arrangements that may be used relative to surface 17 of the waveguide 16. In each case illustrated, electrodes 42 may be deposited directly on the surface 17 or deposited on another medium, which medium includes, in integrated form, driving chip 44. Chip 44 is, then, placed and maintained in engagement with surface 17.

Figure 8A:
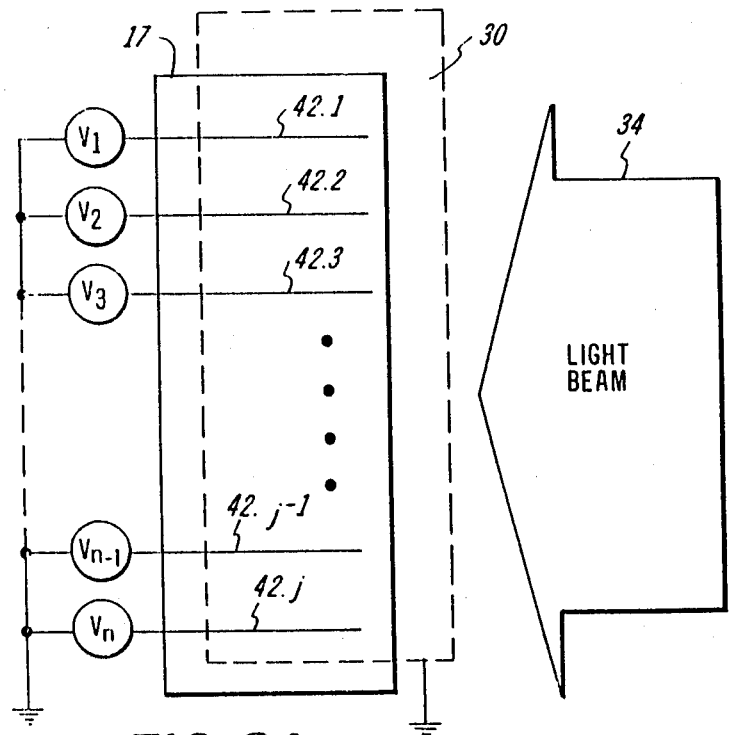
FIG. 8A is a diagrammatic illustration of the array electrodes as independently addressed across the width of the array and referenced to a common plane electrode.
Figure 8B:
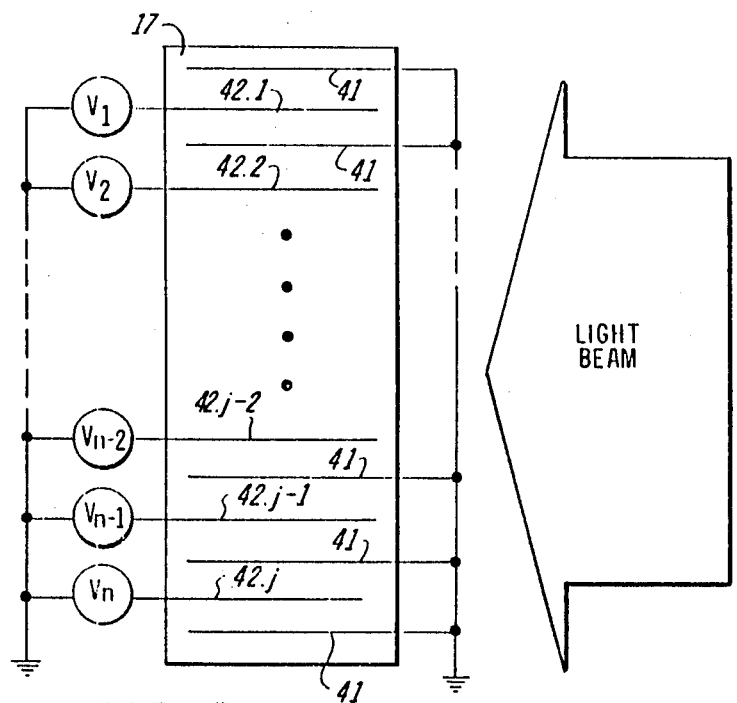
FIG. 8B is a diagrammatic illustration of the array electrodes as independently addressed across the width of the array and referenced to adjacent electrodes connected in common.
Figure 8C:
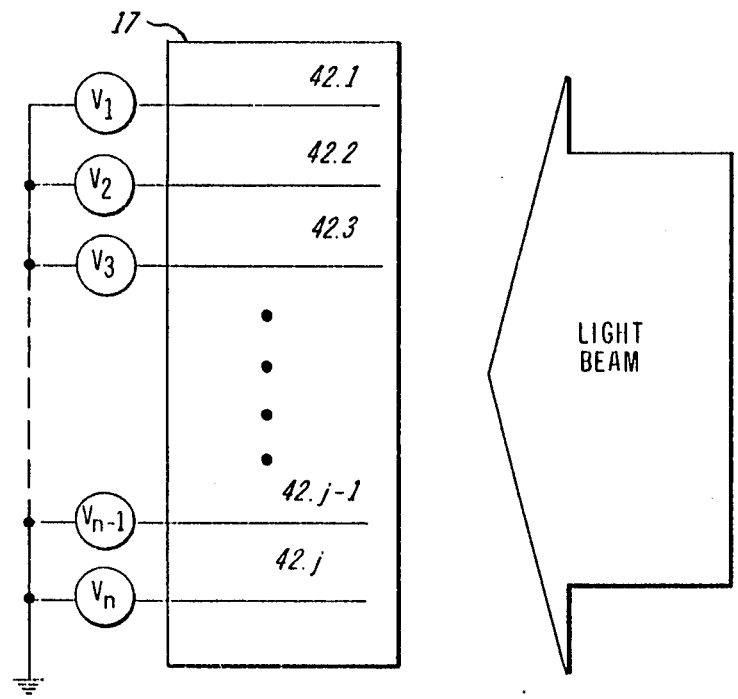
FIG. 8C is a diagrammatic illustration of the array of electrodes as independently addressed across the width of the array and referenced to each other.

In FIG. 8A, the arrangement is shown for FIG. 1. Each electrode may have a value $n\Delta V$ between itself and electrode 30. In FIG. 8B, the arrangement is shown for alternate electrodes, i.e., voltages are applied to one alternate set of electrodes while the other set of alternate electrodes 41 are referenced to ground. Each electrode 42 may have a value $n\Delta V$ between itself and an adjacent reference electrode 41. In FIG. 8C, voltages are applied to all electrodes. There are no ground electrodes. The electrodes in this arrangement are referenced to one another rather than to common reference or to ground. Thus, each electrode may have, for example, a value of $n\Delta V$ between itself and an adjacent electrode 42.

In all arrangements, different voltages are applied to the driving electrodes 42.1, 42.2, 42.3 ... 42.j−1, 42.j.

Voltages across the array of electrodes 42 may be applied in any desired scheme to obtain a desired scanning pattern or effect. In the case of beam scanning, the voltages are applied in a format to produce a desired phase front across the propagating beam. The voltage magnitudes are changed to correspondingly change the phase front of the light beam and thereby reposition the beams at the image plane.

The voltages would be applied across the entire array of electrodes in order to effect the entire phase front of the light beam. For large beam angles, the voltages may be necessarily large due to the number of electrodes to be addressed to change the phase front. The necessity of many different voltages and voltages of undesirably high magnitude result in complex circuit design and complex scanning structure.

This problem may be solved by applying voltages up to a predetermined maximum value, $V_{max}$, in consecutive electrode groups of electrodes 42 across the electrode array. The applied voltages to each electrode group are from a minimum or reference value, starting with the first or initial electrode in each group, to a maximum value, $V_{max}$, at the last electrode in each group.

Figure 11:
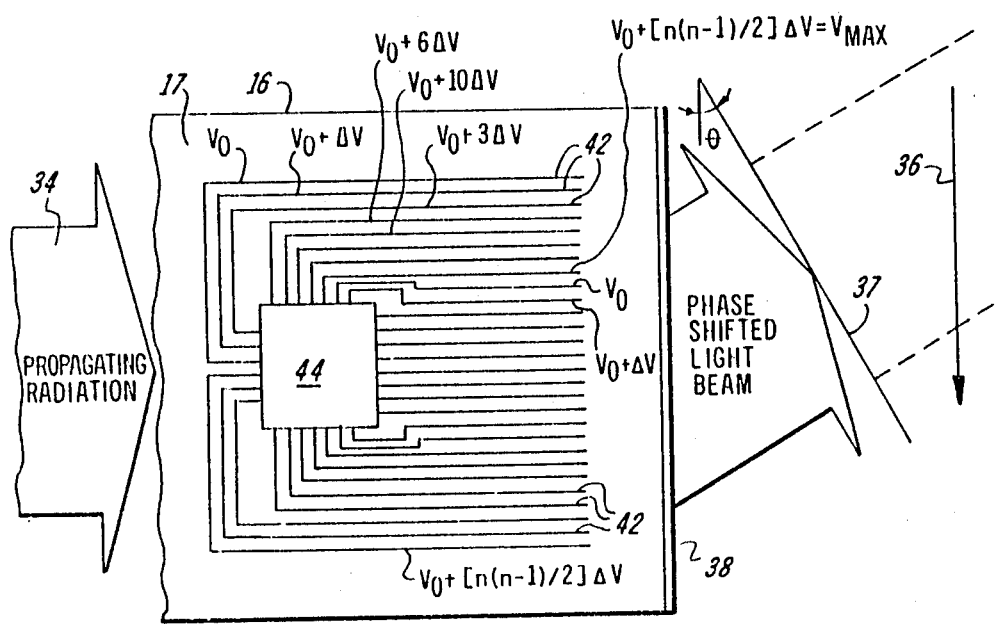
FIG. 11 is a schematic plan view illustrating electrode modulation to produce a linear phase front and to cause the light beam to scan across an image plane.
Figure 12:
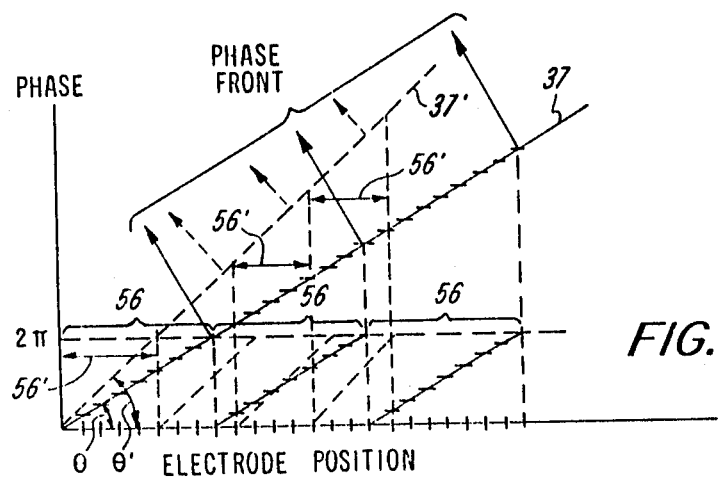
FIG. 12 is a graphic illustration of how the linear phase front is produced in FIG. 8.

The case of linear beam scanning is illustrated in FIGS. 11 and 12. The voltages applied to electrodes 42 in each electrode group would be generally applied in a monotonic manner, i.e., they would increase or decrease from one end of the group to the other. In FIGS. 8A and 8B, the voltages would increase or decrease as a function of $V_n = nV_o$ where $V_o$ is the voltage applied to the initial electrode in each group and n is the number of position of the electrode in the group. In FIG. 8C, the voltages would be applied differently since the electrodes 42 have to be referenced relative to each other in electrode groups. The voltages in this case for any particular electrode, n, would increase as a function of $$V_o = \frac{n(n-1)}{2},$$

Thus, the progression in a group would be $V_o$, $V_o+\Delta V$, $V_o+3\Delta V$, $V_o+6\Delta V$, $V_o+10\Delta V$ . . .

$V_o + [n(n-1)/2]\Delta V$. $V_o$ is the initial electrode voltage applied in each group.

Reference is made to electrode groups in applying a plurality of voltages to electrodes in each group across the electrode array to produce a resultant continuous change to the phase front of the propagating radiation. To produce continuous beam or spot motion at the image plane, the phase front must be continually changed. Thus, the magnitude of the voltages applied to each of the electrodes must change and the size or extent of each electrode group will change in order to approximate the change in phase retardation along the phase front.

For example, the number of electrodes effected to achieve a linear phase front at smaller phase shift angles, $\theta$, will be greater. The number of electrodes affected to achieve a linear phase front at large phase shift angles, $\theta$, will be smaller. Also, the distribution of voltages from an initial value, $V_o$, to $V_{max}$ will change. The number of electrodes involved in a group at any given time would be the amount necessary to achieve the voltage, $V_{max}$ equal to the phase shift $2\pi$ for the instant phase front 37.

In FIG. 12, a greater phase shift is illustrated by dotted lines, with a greater phase shift angle, $\theta'$, the resulting phase front 37' is steeper and the number of electrodes per group 56' is smaller.

As previously indicated, a change of the applied voltage to the electrodes will create bulk electric field (FIGS. 1-3 and 8A) transversely through the transparent waveguide layer 16 or create electric fringe fields (FIGS. 4-6, 8B and 8C) into the surface 17 of the transparent waveguide layer 16. These fields create a change in the refractive index in this radiation propagating medium. This means that a voltage difference, $\Delta V$, times some electrooptic constant, $C_o$, which takes into account the electrooptic effect and the geometry of the waveguide and accompanying electrode structure, provides an index of refraction change in the medium, i.e., $$\Delta V C_o + \Delta n.$$

The bulk or fringe electric fields created by the applied voltages will react over a certain portion of the length of the electrodes, which portion will interact with the light or radiation. This length is designated as interaction length, L, and is represented by the electrode portions shown within the dotted rectangle 51 in FIG. 7. The total refractive index change over the electrode interaction length is represented by $$C_o L V = L \Delta n.$$

Wave propagation in a waveguide medium may be generally identified as $e^{i\beta z}$, wherein $\beta$ is the propagation constant. Over a length L, the wave propagation is $e^{i\beta L}$ and the propagation phase is represented $\beta L$. $\beta$ is also equal to $K_o n$, wherein n is equal to equivalent index of refraction for the waveguide geometry and crystal material and $k_o$ is equal to $2\pi$ divided by the wavelength, $\lambda_o$, in free space. Therefore, the propagation phase, $\beta L$ equals $K_o L n$.

By applying the electric field to the waveguide medium 16 with a voltage change $\Delta V$, from electrode to electrode, a change in the index of refraction is also experienced so that the phase change is represented by $K_o \Delta n L$ and is equal to $C_o K_o L \Delta V$. When a phase change $\beta L$ is equal in value to $2\pi$, there is no phase change since this propagation phase change may be expressed as $$e^{i\beta l} = e^{i(\beta L \pm 2\pi P)}$$

where $$P = 0, +1, +2, \ldots \text{ and}$$

P is mathematical and physical identity. When the phase change, $C_o K_o L \Delta V$ equals $2\pi$, the voltage applied to the electrodes may be reduced to the initial reference voltage or zero voltage and the process repeated for the next consecutive group of electrodes. The resultant effect is a varied voltage application to successive groups of the electrodes across the electrode array at any instantaneous point of time. This produces a corresponding stepwise approximation of desired phase retardation along the phase front of the radiation.

In the case of a linear phase front change, this would be a sawtooth voltage step function across the array. As shown in FIG. 12. The resultant effect on the propagating radiation is the creational appearance of a single linear phase or wave front 37 across the width or radiation 34 propagating at an angle $\theta$ relative to a line perpendicular to the radiation 34. The maximum voltage for each sawtooth function is $2\pi$ and may be represented by $\Delta V_{max}$ wherein $$\Delta V_{max} = \frac{2\pi}{C_o K_o L} = \frac{\lambda_o}{C_o L}.$$

The greater the interaction length, L, the smaller the voltage applied to the electrodes 42 and the smaller the ultimate value of $V_{max}$.

The linear phase front 37 is illustrated in FIG. 11 with FIG. 12 illustrating electrode positions across the array. As just discussed, the voltages are applied from a reference voltage monotonically ($V_o$, $V_o + \Delta V$, $V_o + 3\Delta V$, $V_o + 6\Delta V$, $V_o + 10\Delta V$, $V_o + 15\Delta LV$ ...) across the electrodes until the voltage, $V_{max}$, is reached, which is equivalent to the phase value $2\pi$. The applied voltage for the next succeeding electrode in the next electrode group is reduced to the reference voltage, $V_o$. As illustrated in FIG. 12, this process is repeated for successive identified electrode groups 56. This periodic step function of these applied voltages will produce a corresponding stepwise approximation of a monotonic phase retardation along the phase front. However, the resultant phase front 37 will appear linear.

The number of electrodes in groups 56, as previously indicated, is not fixed for each given linear phase front. For example, the number of electrodes effected to achieve a linear phase front at smaller phase shift angles, $\theta$, will be greater. The number of electrodes effected to achieve a linear phase front at larger phase shift angles, $\theta$, will be smaller. The number of electrodes involved in a group at any given time would be the amount necessary to achieve $\Delta V_{max}$ equal to $2\pi$ for the instant phase front 37, as illustrated in FIG. 12.

The clocking of the shift register 50 provides for the different voltages to be applied in the manner illustrated in FIG. 12. The scanning of the far field beam of radiation, indicated by arrow 36 in FIG. 11, is accomplished by varying the magnitude of the voltages applied across the electrodes 42 and the periodicity of the stepwise approximation of the phase front to vary the resultant phase retardation along the entire phase front in a continuous manner. This is produced by applying a continuous steam serial data input to shift register 50 with each completed serial input representing a particular phase front. Voltages at the outputs 39 represent each positional address of the serial input. As the voltage outputs 39 are being applied to electrodes 42, simultaneously the next serial input for the next slightly changed phase front is being loaded into the shift register at input 46. The addressing electronics necessary for applying such a serial input is well known in the art.

Optical lenses could be employed to focus the far field beam to a spot at image plane. However, this can also be accomplished without lenses employing beam focusing and spot scanning illustrated in FIGS. 13 and 14. The voltages applied to electrodes 42 appear as groups of curvalinear functions.

Figure 13:
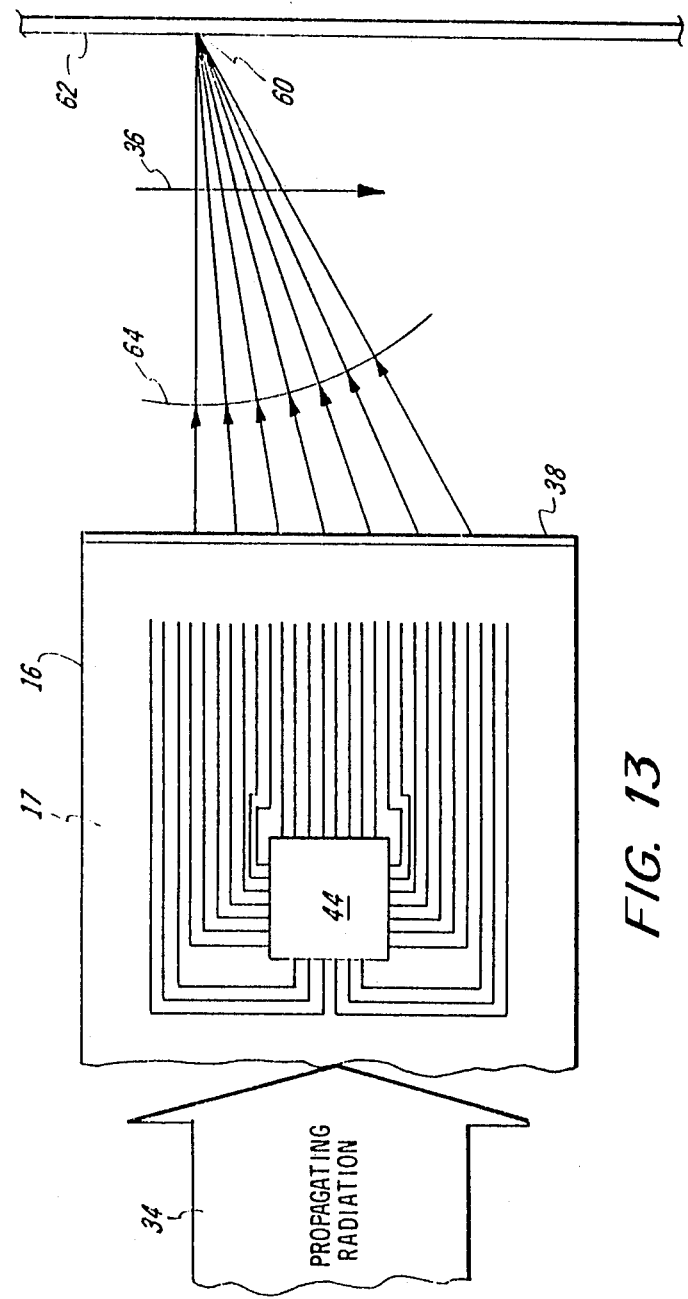
FIG. 13 is a schematic plan view illustrating electrode modulation to produce a curvalinear phase front and to cause the light beam to focus to a spot for scanning across an image plane.
Figure 14:
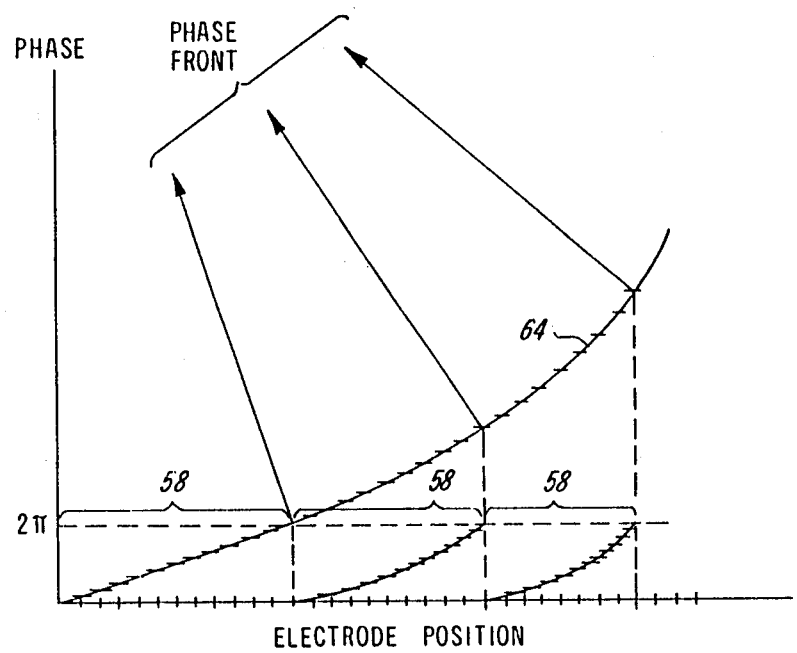
FIG. 14 is a graphic illustration of how the curvalinear phase front is produced in FIG. 9.

The description relating to FIGS. 11 and 12 generally applies to the illustration of spot scanning shown in FIGS. 13 and 14. However, the voltage and relationship change from electrode to electrode is not the same because the resultant phase front is quadratic or curvalinear. The number of electrodes per electrode group 58 for an instantaneous phase front will not be equal because the phase front 64 is curvalinear. The shape of phase front 64 is designed to reflect portions of the light so that the beam will be focused to a spot 60 at image plane 62. The spot 60 is caused to scan across the image plane 62 (indicated by arrow 36) by periodically changing the magnitude of the applied voltages across the electrode array so that some of the applied voltages will be increasing while others will be decreasing to maintain the curvalinear form and focus the incident beam to spot 60 as it is displaced from point to point across the image plane 62 (pixel to pixel) by systematic electrode addressing.

Whether a linear or curvalinear phase front, the return scan of the far field beam is accomplished by applying voltages across the electrode array in a direction and addressing pattern opposite to that illustrated in FIGS. 12 and 14.

Figure 15:
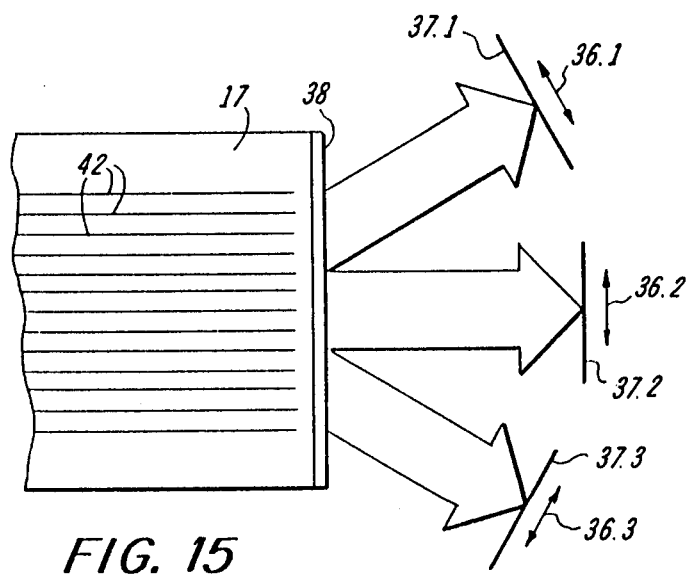
FIG. 15 is a diagrammatic illustration of beam splitting and multiple beam scanning.

Applications of the addressing scheme described is not limited to scanning. For example, the voltages to electrodes 42 may be applied to produce a plurality of beams or spots. Each electrode acts to produce a separate light filament and be controlled to split the radiation beam into a plurality of beams or spots which, in turn, may be moved in any desired path or pattern across the image plane or scanned across the image plane in a sequential or simultaneous manner. Beam splitting and multiple scanning is illustrated in FIG. 15. Sections of electrodes 42 are devoted to producing independent beams 36.1, 36.2 and 36.3 having linear phase fronts 37.1, 37.2 and 37.3. Electrode addressing would be the same as previously explained in connection with FIGS. 11 and 12, except accomplished in multiple fashion. The multiple beams with phase fronts 37.1, 37.2 and 37.3 could also be spot focused and independently scanned according to the electrode addressing described in connection with FIGS. 13 and 14.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. In an optical scanner comprising at least one thin waveguide medium on a substrate, means to couple a wide collimated beam of radiation into one end of said medium, a periodic array of substantially parallel, spaced electrodes associated with one major surface of said medium, at least a portion of the lengths of said electrodes extending in a direction substantially parallel with the direction of propagation of said radiation in said medium, means to apply voltages in a pattern to said electrodes which vary from one electrode to the next adjacent electrode to a predetermined value over several of said electrodes and wherein the same pattern of voltages or a similar pattern of different voltages is applied over several of the next of said electrodes to said predetermined value whereby the pattern is completed across said electrode array to produce a corresponding approximation of a desired phase retardation along the phase front of said radiation and means to change the magnitude of said applied voltages across said electrodes to vary the apprximation of the phase retardation to cause said radiation beam to scan in a direction transverse to the direction of propagation of said radiation in said medium.

2. In the optical scanner of claim 1, wherein the voltages as applied to said electrodes are referenced from one electrode to the next adjacent electrode over said several electrodes.

3. In the optical scanner of claim 1 or 2, said predetermined value being equivalent to the phase value 2 pi.

* * * * *